United States Patent
Hatanaka

(10) Patent No.: US 6,642,766 B2
(45) Date of Patent: Nov. 4, 2003

(54) DIGITAL CIRCUIT, LSI INCLUDING THE SAME AND METHOD FOR REMOVING NOISE

(75) Inventor: Norio Hatanaka, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/973,887

(22) Filed: Oct. 11, 2001

(65) Prior Publication Data

US 2002/0044000 A1 Apr. 18, 2002

(30) Foreign Application Priority Data

Oct. 12, 2000 (JP) ........................................ 2000-311581

(51) Int. Cl.[7] ................................................ G06F 1/04
(52) U.S. Cl. ........................................ 327/291; 141/144
(58) Field of Search ................................. 327/141, 144, 327/145, 160, 291, 294, 295, 296; 365/154

(56) References Cited

U.S. PATENT DOCUMENTS

| 4,153,814 A | * | 5/1979 | Burgert ........................ 375/242 |
| 4,622,690 A | * | 11/1986 | Smith et al. .................. 704/207 |
| 4,973,860 A | * | 11/1990 | Ludwig ........................ 327/145 |
| 5,099,141 A | * | 3/1992 | Utsunomiya .................. 327/145 |
| 5,570,307 A | | 10/1996 | Takahashi .................... 364/717 |

* cited by examiner

*Primary Examiner*—Timothy P. Callahan
*Assistant Examiner*—Linh Nguyen
(74) *Attorney, Agent, or Firm*—McDermott, Will & Emery

(57) ABSTRACT

A digital circuit, which avoids problems in LSIs including erroneous operation even when noise is superposed on a clock signal, is provided. A frequency divider divides the frequency of a first clock signal to generate a raw clock signal. A first flip-flop synchronizes the raw clock signal with a second clock signal. A second flip-flop synchronizes an output signal of the first flip-flop with the first clock signal and outputs the synchronized signal as a reproduced clock signal.

13 Claims, 7 Drawing Sheets

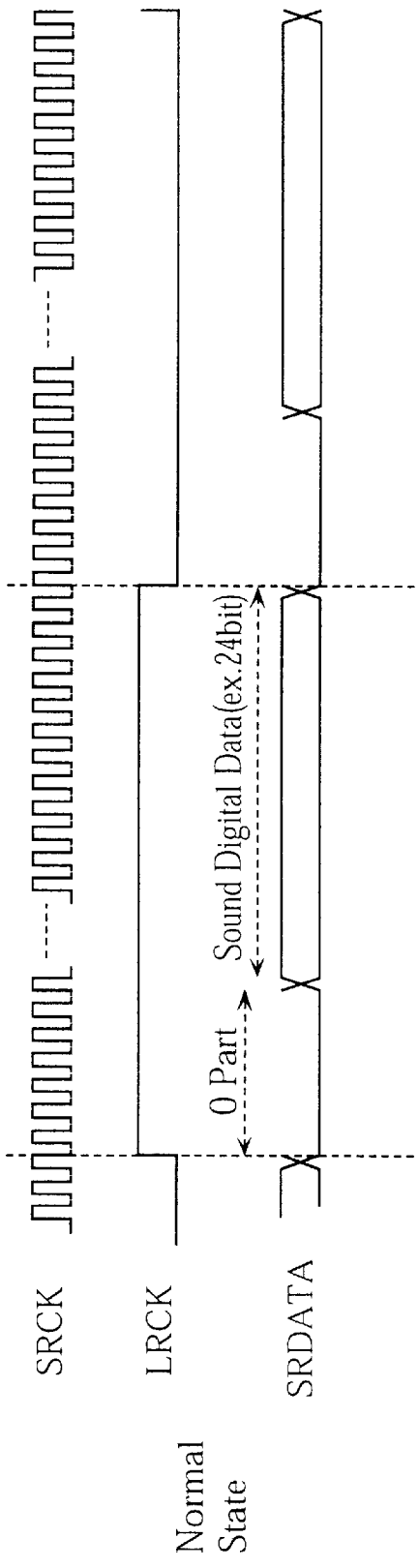
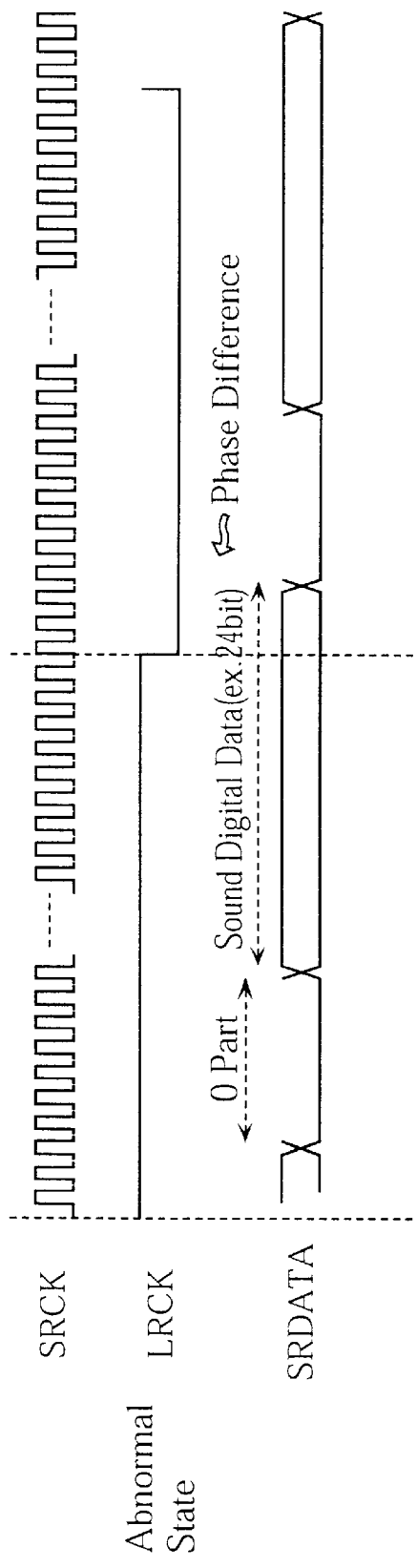

DIGITAL CIRCUIT, LSI INCLUDING THE SAME AND METHOD FOR REMOVING NOISE

BACKGROUND OF THE INVENTION

The present invention relates to a technique for suppressing erroneous operation resulting from noise superposed on a clock signal in an LSI.

Recently, in LSIs for use in processing audio signals, digital signal processors (DSPs) perform complicated operation processing and thus are required to operate at high-frequency clock speeds. At the same time, an output from an LSI has to be a signal synchronized with a clock signal that is a multiple of the sampling rate of the LSI. Also, for processors such as many which process both sound and video, a clock signal for use in operation processing and another clock signal for use in outputting an audio signal are totally asynchronous in many cases.

FIG. 6 is a circuit diagram of a known digital circuit, which is used in the LSI. In FIG. 6, a frequency divider 20 consists of a flip-flop 21 which operates synchronously with a signal output clock signal CK1 and an inverter 22. The frequency divider 20 divides the frequency of the signal output clock signal CK1 and outputs the signal thus obtained as a signal S1. The low-potential-level (which will be herein referred to as an "L-level") interval of the signal S1 corresponds to one cycle of the clock signal CK1. The high-potential-level (which will be herein referred to as an "H-level") interval of the signal S1 is equal to an integral multiple of one cycle of the clock signal CK1.

A differentiator 30 consists of flip-flops 31 and 32, which operate synchronously with an operation-processing-dedicated clock signal CK2, an inverter 33 and an OR gate 34. The differentiator 30 generates a signal S2 from the signal S1 and outputs the signal S2. The signal S2 falls in response to the trailing edge of the signal S1, and the L-level interval thereof corresponds to one cycle of the clock signal CK2.

A first counter 41 operates synchronously with the clock signal CK1, and counts the number of pulses of the clock signal CK1 only when the input signal S1 is in the L-level interval. A second counter 42 operates synchronously with the clock signal CK2, and counts the number of pulses of the clock signal CK2 only when the input signal S2 is in the L-level interval. The output CT1 of the first counter 41 is used for, for example, generating a timing control signal supplied to a circuit in a succeeding stage of the LSI. The output CT2 of the second counter 42 is used for, for example, signal generation timing control inside of the LSI.

In the known digital circuit, however, when noise is superposed on a signal output clock signal, noise components cause a large difference in operating speed between a circuit section which operates synchronously with the operation-processing-dedicated clock signal and another circuit section which operates synchronously with the signal output clock signal. Erroneous operation due to this difference might cause inconveniences in outputting.

FIG. 7 is a timing diagram illustrating the operation of the digital circuit shown in FIG. 6 and illustrates a situation in which noise is superposed on the clock signal CK1. As shown in FIG. 7, when noise with a higher frequency than that of the output clock signal CK1 is superposed on the clock signal CK1, noise components also appear on the signal S1 which is generated by dividing the clock signal CK1. As a result, in response to the noise components, the count CT1 of the first counter 41 increases much faster than intended. In contrast, the signal S2 via the differentiator 30 leaves only part of noise components. Thus, the second counter 42, which operates in response to the signal S2, is not affected by the noise. As a result, a large difference in operation speed occurs between the count CT1 of the first counter 41 and the count CT2 of the second counter 42. This difference affects timing control of the LSI and its peripheral circuits, and sometimes causes noise on a reproduced audio signal or erroneous operation of devices.

SUMMARY OF THE INVENTION

It is therefore an object of the present invention to provide a digital circuit and a method for removing noise and whereby problems in LSIs, such as erroneous operation, can be obviated even when the noise is superposed on a clock signal.

Specifically, a digital circuit according to the present invention includes a clock generator for receiving a first clock signal and generates a raw clock signal synchronized with the first clock signal, a first circuit section which outputs the raw clock signal synchronously with a second clock signal, and a second circuit section which outputs, as a reproduced clock signal, the output signal from the first circuit section synchronously with the first clock signal.

In the inventive digital circuit, the raw clock signal synchronized with the first clock signal is synchronized with the second clock signal and output by the first circuit section. Then, the output signal from the first circuit section is synchronized with the first clock and output as a reproduced clock signal by the second circuit section. Accordingly, even when noise is superposed on the first clock signal, noise components of the reproduced clock signal are greatly reduced.

In the inventive digital circuit, the first clock signal is preferably a signal for outputting a particular signal and the second clock signal is preferably a signal for use in operation processing.

In the inventive digital circuit, the first circuit section preferably includes a flip-flop which receives the raw clock signal at a data input and receives the second clock signal at a clock input. Also, the second circuit section preferably includes a flip-flop which receives the output signal from the first circuit section at a data input and receives the first clock signal at a clock input.

In the inventive digital circuit, the frequency of the second clock signal is preferably higher than twice the frequency of the raw clock signal.

An LSI according to the present invention includes the digital circuit and a DSP which performs operation processing in response to the second clock signal.

Also, an inventive method for removing noise includes the steps of a) generating a raw clock signal synchronized with a first clock signal from the first clock signal, b) synchronizing the raw clock signal with a second clock signal, and c) synchronizing the signal obtained by the step b) with the first clock signal, thereby generating a reproduced clock signal.

In the inventive method, the raw clock signal synchronized with the first clock signal is synchronized with the second clock signal and output. This output signal is further synchronized with the first clock signal again and output as a reproduced clock signal. Accordingly, even when noise is superposed on the first clock signal, noise components of the reproduced clock signal can be greatly reduced.

In the above inventive method, the first clock signal is preferably a signal for outputting a particular signal and the second clock signal is preferably a signal for use in operation processing.

BRIEF DESCRIPTION OF THE DRAWINGS

FIG. 5A illustrates waveforms of output signals of the LSI in the normal state; and FIG. 5B illustrates waveforms of output signals of the LSI in the abnormal state.

DESCRIPTION OF THE PREFERRED EMBODIMENTS

Hereinafter, preferred embodiments of the present invention will be described with reference to the accompanying drawings.

Figure 1:
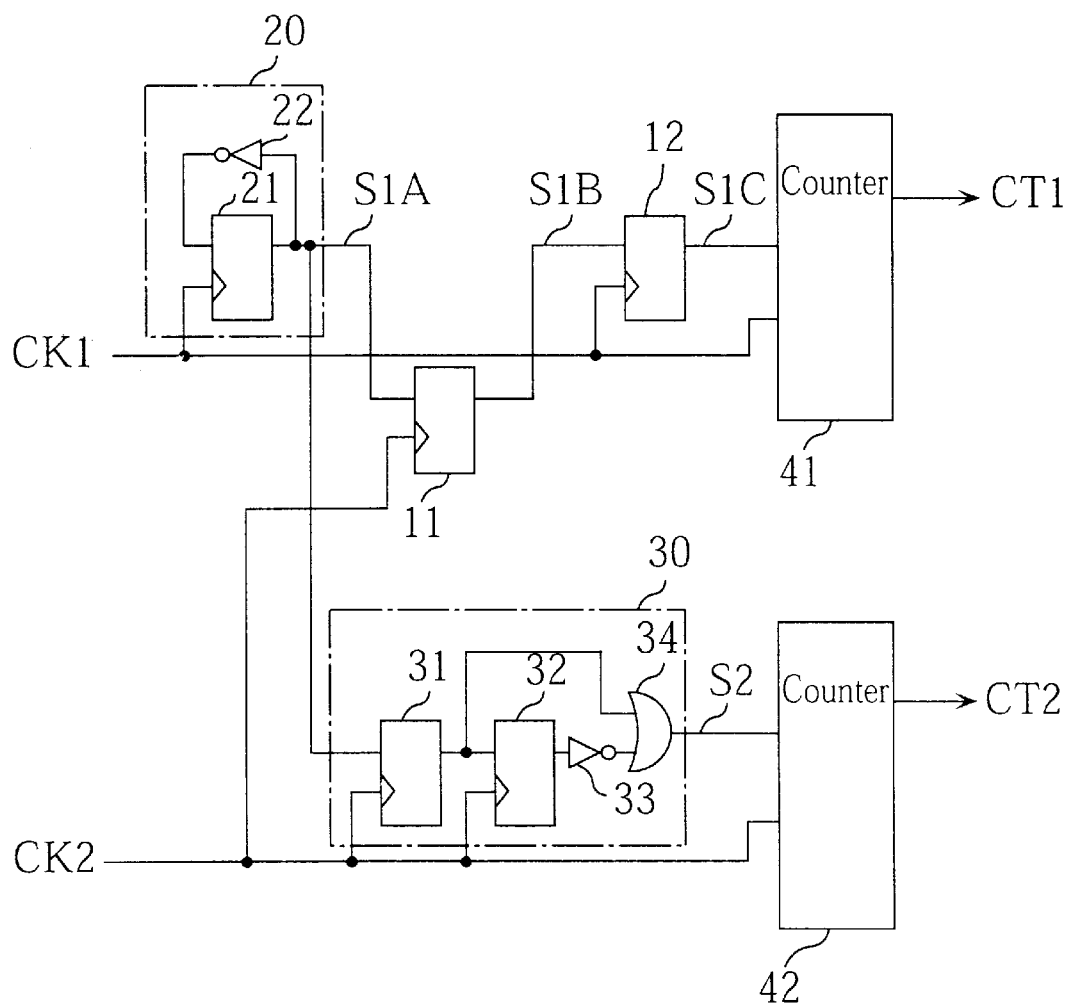
FIG. 1 is a circuit diagram illustrating the configuration of a digital circuit according to an embodiment of the present invention.
Figure 6:
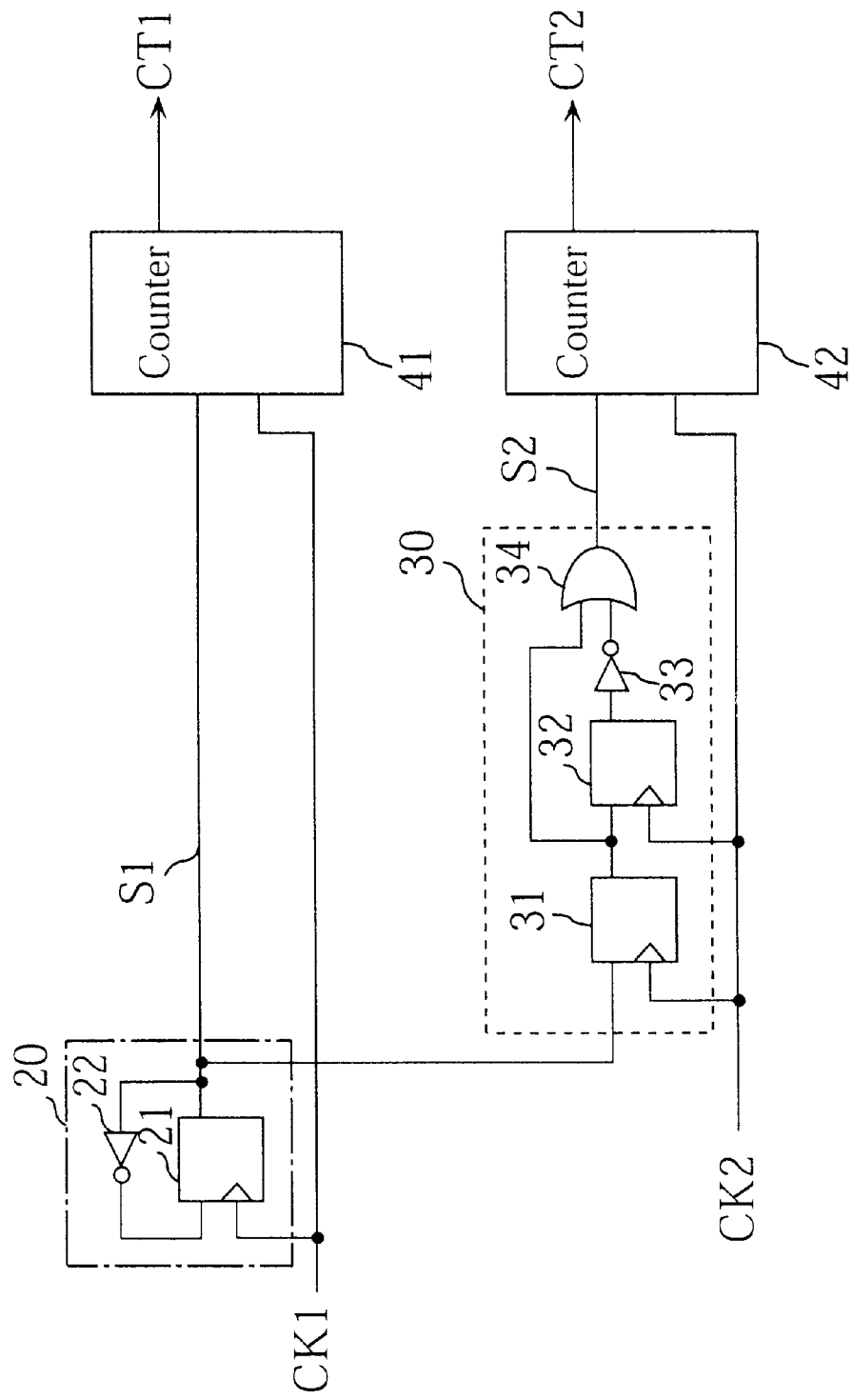
FIG. 6 is a circuit diagram of a known digital circuit.
Figure 7:
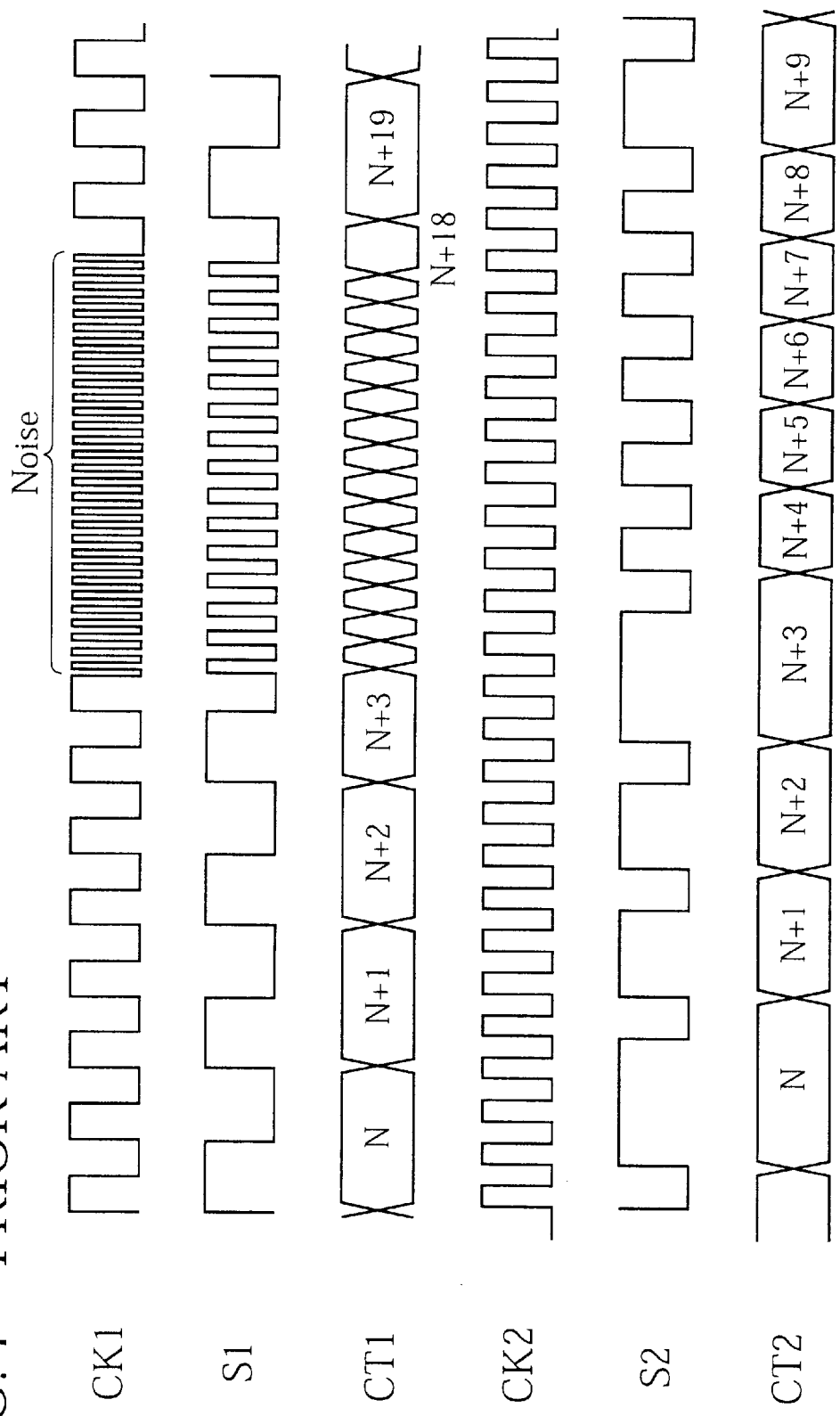
FIG. 7 is a timing diagram illustrating the operation of the digital circuit of FIG. 6 when noise is superposed on a clock signal.

FIG. 1 is a circuit diagram illustrating a digital circuit according to an embodiment of the present invention. In FIG. 1, the reference numeral 20 denotes a frequency divider as a clock generator. The reference numeral 30 denotes a differentiator. The reference numeral 41 denotes a first counter. The reference numeral 42 denotes a second counter. These components have the same configuration as shown in FIG. 6. In FIG. 1, the circuit further includes a first flip-flop 11 as a first circuit section which receives a second clock signal CK2 at a clock input and operates synchronously with the second clock CK2, and a second flip-flop 12 as a second circuit section which receives a first clock signal CK1 at a clock input and operates synchronously with the first clock CK1. The first and second flip-flops 11 and 12 are disposed between the frequency divider 20 and the first counter 41.

In this embodiment, it is assumed that the digital circuit shown in FIG. 1 is built in an LSI including a DSP for use in operation processing. It is also assumed that the first clock signal CK1 is a signal for outputting a particular signal and the second clock signal CK2 is a signal for use in operation processing by the DSP.

The frequency divider 20 consists of a flip-flop 21 which operates synchronously with the first clock signal CK1 and an inverter 22. The frequency divider 20 divides the frequency of the input first clock signal CK1 and outputs the signal thus obtained as a signal S1A.

The first flip-flop 11 receives the signal S1A as a raw clock signal at a data input, synchronizes the signal S1A with the second clock signal CK2 and then outputs the obtained signal as a signal S1B. The second flip-flop 12 synchronizes the output signal S1B from the flip-flop 11 with the first clock signal CK1 and outputs the obtained signal as a reproduced clock signal, i.e., a signal S1C.

The differentiator 30 consists of two flip-flops 31 and 32 which operate synchronously with the second clock signal CK2, an inverter 33 and an OR gate 34. The circuit 30 generates a signal S2 from the input signal S1A which is the raw clock signal input therein to, and outputs the signal S2. The signal S2 falls in response to the trailing edge of the signal S1A, and the L-level interval thereof corresponds to one cycle of the second clock signal CK2.

The first counter 41 operates synchronously with the first clock signal CK1, and counts the number of pulses of the clock signal CK1 only when the input signal S1C is in the L-level interval. Also, the second counter 42 operates synchronously with the second clock signal CK2, and counts the second clock signal CK2 only when the input signal S2 is in the L-level interval. The output CT1 of the first counter 41 is used for, for example, generating a timing control signal supplied to a circuit in a succeeding stage of the LSI. The output CT2 of the counter 42 is used for, for example, timing control of signal generation inside of the LSI.

Figure 2:
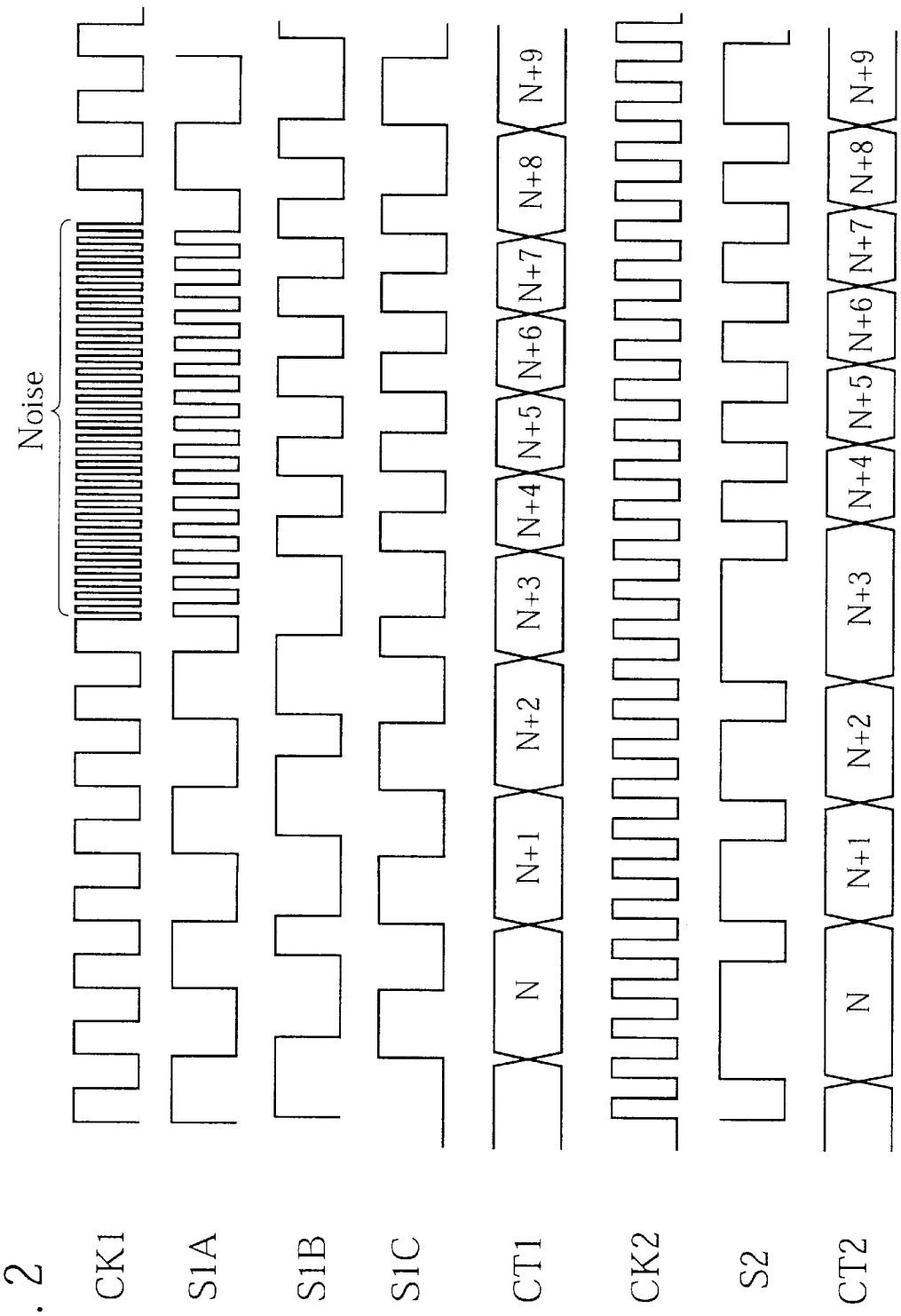
FIG. 2 is a timing diagram illustrating the operation of the digital circuit of FIG. 1 when noise is superposed on a clock signal.

FIG. 2 is a timing diagram illustrating the operation of the digital circuit shown in FIG. 1 and illustrates a situation in which noise with a higher frequency than that of the first clock CK1 is superposed on the first clock CK1.

As shown in FIG. 2, when the noise is superposed on the first clock signal CK1 and the signal waveform of the clock signal is modified, the signal S1A frequency-divided by the frequency divider 20 also contains a frequency-divided noise waveform. However, the first flip-flop 11, which has received the signal S1A, operates synchronously with the second clock CK2 and thus passes only part of high-frequency noise components. Therefore, the output signal S1B has a noise-reduced waveform as shown in FIG. 2. The signal S1B is received by the second flip-flop 12 and then reproduced as the signal S1C synchronized with the first clock signal CK1. This signal S1C is supplied to the first counter 41 as a reproduced clock signal.

Accordingly, it is possible to reduce the difference between the counts of the first counter 41 which operates synchronously with the first clock signal CK1 and the second counter 42 which operates synchronously with the second clock signal CK2. Therefore, erroneous operation of the LSI can be avoided.

That is to say, the digital circuit shown in FIG. 1 performs the following method for removing noise. First, from the first clock signal CK1, a raw clock signal S1A is generated which is synchronized with the first clock signal CK1. Then, the raw clock signal S1A is synchronized with the second clock signal CK2 and thereby a signal S1B is generated. The signal S1B is synchronized with the first clock CK1 and thereby a reproduced clock signal S1C is generated. In this manner, the adverse effects due to the noise superposed on the first clock CK1 can be eliminated as intended.

In addition, to remove the noise as intended, the frequency of the second clock signal CK2 is preferably higher than twice the frequency of the raw clock S1A.

The first and second circuit sections may include some combinatorial logic circuit other than the flip-flop. Also, any other components, which would be able to synchronize an input signal with another clock signal and output the synchronized signal, as well as the flip-flop can be used for the first and second circuit sections. The frequency divider 20 may have a different configuration. Also, other components which output the first clock signal CK1 as a raw clock signal without dividing the frequency of the first clock signal CK1 can be used instead of the frequency divider 20.

Figure 3:
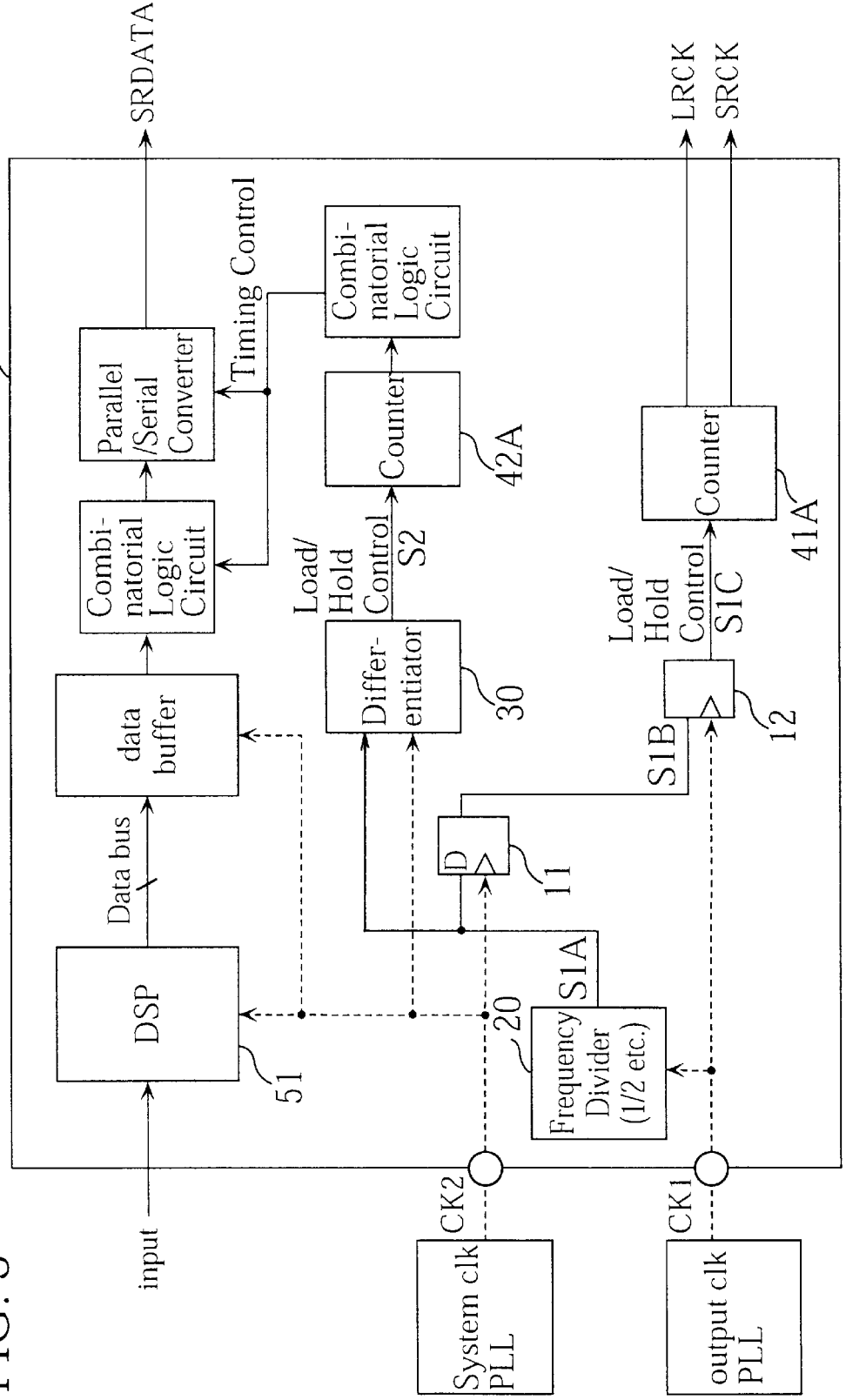
FIG. 3 is a block diagram illustrating the configuration of an LSI in which the digital circuit of FIG. 1 is built.

FIG. 3 is a block diagram illustrating an example of an LSI1 which includes the digital circuit shown in FIG. 1. In FIG. 3, the same components as in FIG. 1 are identified by the same reference numerals. Counters 41A and 42A shown in FIG. 3 are for use in LSI1 and respective modified ones of the counters 41 and 42 shown in FIG. 1.

LSI1 shown in FIG. 3 includes DSP51 which receives the second clock signal CK2 as an operation-processing-dedicated clock signal. That is to say, in the example shown in FIG. 3, to remove the noise from the first clock signal CK1, the operation-processing-dedicated clock signal to be supplied to DSP51 is used as the second clock signal CK2. In this case, the frequencies of the first clock signal CK1 and the second clock signal CK2 are approximately 18 MHz and 81 MHz, respectively, and thus the noise can be removed effectively.

Figure 4:
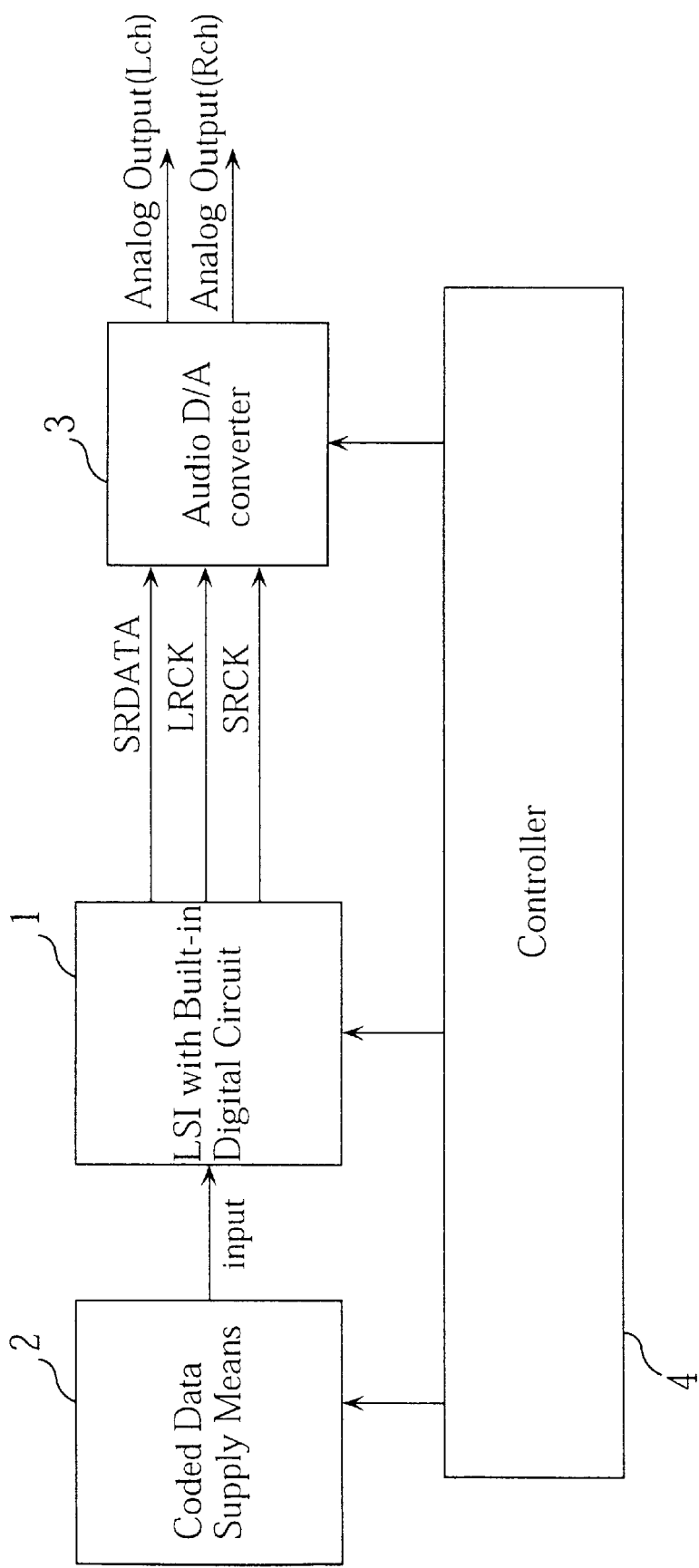
FIG. 4 illustrates an example of system configurations including the LSI shown in FIG. 3.

FIG. 4 illustrates an example of system configurations including LSI1 shown in FIG. 3. The system shown in FIG. 4 relates to an audio system. The system includes a coded data supply means 2 typified by a disk reader and a broadcast receiving tuner, an audio D/A converter 3 and a controller 4 for controlling the coded data supply means 2 and the audio D/A converter 3 as well as LSI1. LSI1 performs operation processing on the coded data input supplied by the coded data supply means 2 with DSP51 and outputs a digital data SRDATA. At the same time, LSI1 also outputs control clock signals LRCK and SRCK for controlling the operation of the audio D/A converter 3 in a succeeding stage. The audio D/A converter 3 converts the digital data SRDATA in accordance with control clock signals LRCK and SRCK and outputs analog signals for sound reproduction.

FIGS. 5A and 5B are timing diagrams illustrating signal waveforms of SRCK, LRCK and SRDATA that are the outputs of LSI1; FIG. 5A illustrates signal waveforms in the normal state and FIG. 5B those in the abnormal state. As shown in FIG. 5A, in the normal state, the digital data SRDATA and the control clock signal LRCK are in phase with each other, and therefore sound will be reproduced and output without any problem.

In the abnormal state due to noise or other factors, however, a phase difference between the digital data SRDATA and the control clock signal LRCK occurs as shown in FIG. 5B. In this case, part of a signal, which is not originally audio data, is D/A converted as an audio signal. Accordingly, reproduced sound such as music contains noise. Sometimes, signals with unexpected tones and volumes out of specifications for a particular device, e.g., loudspeaker, are reproduced and might cause damage on the device.

When an LSI includes the inventive digital circuit, however, no phase difference between signals due to noise superposed on a clock signal occurs and therefore the problems as described above can be avoided.

As can be seen from the above, in the present invention, even when noise is superposed on the first clock signal, noise components of the reproduced clock signal can be greatly reduced. Therefore, erroneous operation of the LSI resulting from noise superposed on clock signals can be obviated.

What is claimed is:

1. A digital circuit comprising:
   a clock generator which receives a first clock signal and generates a raw clock signal synchronized with the first clock signal;
   a first circuit section which outputs the raw clock signal synchronously with a second clock signal; and
   a second circuit section which outputs, as a reproduced clock signal, the output signal from the first circuit section synchronously with the first clock signal.

2. The circuit of claim 1, wherein the first clock signal is for outputting a particular signal and
   wherein the second clock signal is for use in operation processing.

3. The circuit of claim 1, wherein the first circuit section includes a flip-flop which receives the raw clock signal at a data input and receives the second clock signal at a clock input.

4. The circuit of claim 1, wherein the second circuit section includes a flip-flop which receives the output signal from the first circuit section at a data input and receives the first clock signal at a clock input.

5. The circuit of claim 1, wherein the frequency of the second clock signal is higher than twice the frequency of the raw clock signal.

6. An LSI comprising:
   the digital circuit of the claim 1; and
   a DSP which performs operation processing in response to the second clock signal.

7. A method for removing noise, comprising the steps of:
   a) generating a raw clock signal synchronized with a first clock signal from the first clock signal;
   b) synchronizing the raw clock signal with a second clock signal; and
   c) synchronizing the signal obtained by the step b) with the first clock signal, thereby generating a reproduced clock signal.

8. The method of claim 7, wherein the first clock signal is for outputting a particular signal and
   wherein the second clock signal is for use in operation processing.

9. The digital circuit according to claim 1, wherein said clock generator comprises a frequency divider.

10. The digital circuit according to claim 9, wherein said frequency divider comprises a flip-flop having a clock input and a data input, and an inverter, said first clock signal being coupled to said clock input, said inverter coupling an output signal of said flip-flop to said data input.

11. The digital circuit according to claim 1, wherein the frequency of said first clock signal is a multiple of the frequency of said raw clock signal.

12. The digital circuit according to claim 1, wherein the second circuit continually outputs said reproduced clock signal during operation.

13. A digital circuit comprising:
   a clock generator which receives a first clock signal and generates a raw clock signal synchronized with the first clock signal;
   a first circuit section which outputs the raw clock signal synchronously with a second clock signal; and
   a second circuit section which outputs, as a reproduced clock signal, the output signal from the first circuit section synchronously with the first clock signal;
   a differentiator circuit section which receives said second clock signal as a clock signal and said raw clock signal as a data signal, said differentiator outputs a third clock signal;
   a first counter which operates synchronously with said first clock signal and which counts a number of pulses of said reproduced clock signal; and
   a second counter which operates synchronously with said second clock signal and which counts a number of pulses of said third clock signal.

* * * * *